United States Patent [19]

Kaplan

[11] Patent Number: 4,642,567
[45] Date of Patent: Feb. 10, 1987

[54] METHODS FOR TWO DIMENSIONAL NUCLEAR MAGNETIC RESONANCE IMAGING

[75] Inventor: Jerome I. Kaplan, Indianapolis, Ind.

[73] Assignee: Indiana University Foundation, Bloomington, Ind.

[21] Appl. No.: 617,163

[22] Filed: Jun. 4, 1984

[51] Int. Cl.[4] .............................................. G01R 33/20
[52] U.S. Cl. ...................................... 324/309; 324/307
[58] Field of Search ........ 324/300, 307, 309, 311–314, 324/318, 322

[56] References Cited

U.S. PATENT DOCUMENTS 4,307,343 12/1981 Likes .................................... 324/307
4,354,157 10/1982 Feiner .................................. 324/312

FOREIGN PATENT DOCUMENTS 0021535 1/1981 European Pat. Off. ................... 24/8
0024640 3/1981 European Pat. Off. ................... 24/8

Primary Examiner—Michael J. Tokar
Attorney, Agent, or Firm—Kirkland & Ellis

[57] ABSTRACT

Improved two dimensional nuclear magnetic resonance imaging methods of the present invention are presented which comprise sensitizing a two dimensional slice of an object by standard procedures in a static magnetic field wherein the magnetization of the spins is transverse to the static field, applying a time varying magnetic field gradient to the sensitized two dimensional slice, detecting radiated electromagnetic energy from the two dimensional slice, and reconstructing spin information for each element within a slice from the detected radiated electromagnetic energy. In one aspect, the improvement is the use of an appropriate weighting function in the reconstruction to weight the detected radiated electromagnetic energy signals to compensate for the use of time varying magnetic field gradients that do not sample equal area elements of phase space in equal time intervals. In another independent aspect, almost any magnetic field gradient function may be used, that does not sample equal areas of phase space during equal time intervals, and a procedure defined by which spin information for equal areas of phase space is detected at unequal times. In yet another aspect, a uniquely specified class of time varying magnetic field gradient trajectories are defined which may equal area elements of two dimensional phase space in equal time intervals.

7 Claims, 3 Drawing Figures

METHODS FOR TWO DIMENSIONAL NUCLEAR MAGNETIC RESONANCE IMAGING

BACKGROUND OF THE INVENTION a. Field of the Invention

The present invention relates to methods for obtaining improved two dimensional nuclear magnetic resonance (NMR) images from those disclosed in the art. The use of time varying magnetic field gradients such that the frequency history of the spins is every element of a two dimensional array is distinguishable from that of every other element in that array have been described in the art. However, the methods described in the art do not, in fact, provide tractible approaches for obtaining two dimensional NMR images from the use of such time varying magnetic field gradients.

b. Description of the Prior Art

A number of NMR techniques for spacial mapping of points, lines, and planes in a sample of matter are known in the art. The particular procedure whereby the use of time varying magnetic field gradients such that the frequency history of each element in an array is distinguishable from that of every other element in that array has been suggested in the patent to Likes (U.S. Pat. No. 4,307,343).

However, the methods described by Likes suffer from a number of shortcomings. First, Likes fails to recognize the necessity of an appropriate weighting function which is required for image reconstruction, and is necessitated by the use of gradient magnetic fields whose trajectories in phase space do not sample equal areas of that space during equal time intervals.

For example, beginning at column 10, line 27, Likes discloses the use of Lissajous, "bull's eye" and rosette trajectories as the time varying magnetic field gradients to achieve spatial differentiation. However, none of these trajectories map equal areas of space over equal time intervals. Accordingly, inaccuracies result from the use of the methods disclosed in the Likes patent to reconstruct the image, without compensating for the nonlinear relationship of the trajectory's path in phase space with respect to time.

It is therefore an object of the present invention to provide novel methods for NMR mapping of two dimensional samples of matter whereby magnetic field gradients map equal areas of phase space in equal intervals of time.

It is yet another object of the present invention to provide methods for NMR mapping whereby magnetic field gradients may equal areas of phase space in unequal intervals of time, which times can be obtained from an appropriate weighing function.

It is yet a further object of this invention to provide novel reconstruction methods for reconstructing two dimensional images from NMR information obtained from samples of matter while utilizing gradient magnetic fields having trajectories that do not sample equal areas of phase space during equal intervals of time.

SUMMARY OF THE INVENTION

Improvements to nuclear magnetic resonance imaging methods are presented. Standard nuclear magnetic resonance imaging methods comprise sensitizing a two dimensional slice of an object in the presence of a static magnetic field. Within this slice the magnetization of the nuclear spins is caused to be rotated at each point transverse to the static field. A time varying magnetic field gradient is then applied to the sensitized two dimensional slice, and electromagnetic energy radiated from the two dimensional slice is detected. Spin information for each area element within a slice is then reconstructed from the received radiated electromagnetic energy. Each of these above steps are generally known to one of ordinary skill in the art, as disclosed by the Likes patent and the articles referenced therein. In one aspect, the improvement is the use of an appropriate weighting function in the reconstruction to weight the received radiated electromagnetic energy signals to compensate for the use of time varying magnetic field gradients that do not sample equal areas of phase space with equal time. In another independent aspect, almost any magnetic field gradient function which substantially covers two dimensional phase space may be used, that does not sample equal areas of phase space in equal time periods, and a procedure defined by which equal areas of phase space are mapped by sampling at unequal times. In yet another aspect, a uniquely specified class of time varying magnetic field gradient trajectories are defined which map equal area elements of two dimensional phase space in equal time intervals.

DETAILED DESCRIPTION OF THE INVENTION

Figure 1:
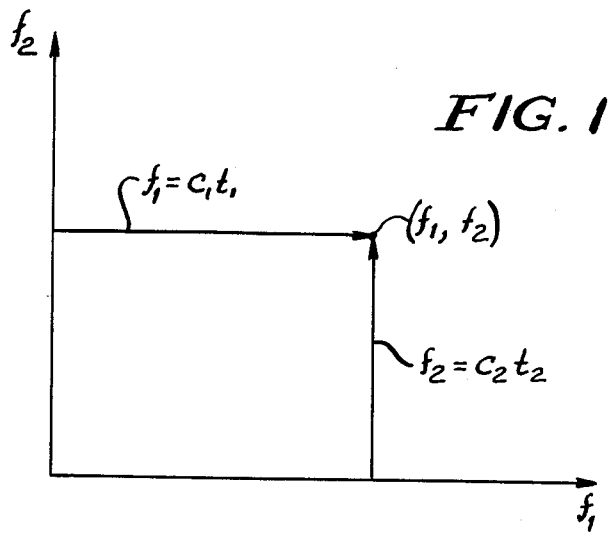
FIG. 1 is a graphic depiction of phase space parameters.

All nuclei with magnetic moments, an example being the hydrogen nucleus, when placed in a static magnetic field, precess (at a frequency $\omega\gamma$) about the magnetic field direction. Applying an effective 90° electromagnetic pulse to a nucleus in a magnetic field at a frequency close to the frequency of the angular precession induces a rotation of the magnetization to a direction transverse to the direction of the static magnetic field (the nucleus absorbs energy). The return of the magnetization to equilibrium generates radiation, which radiation may be sampled or detected. In a bulk sample containing many nuclei the time course for such radiation is a function of the environment of the nuclei, via the longitudinal relaxation time ($T_1$) and the transverse relaxation time ($T_2$). In general $T_1$ is usually much larger than $T_2$.

In two dimensional nuclear magnetic imaging the nuclear spin information is determined for individual area elements within a two dimensional slice of matter. It is critical in two dimensional imaging that the spin information from one element be distinguishable from the spin information from every other element within the slice. One method, suggested by Likes in U.S. Pat. No. 4,307,343, is to use time varying magnetic field gradients within the sensitized two dimensional slice so that the frequency history of the spins in each element in the slice is distinguishable from that of every other element. Variations on this general approach are more fully described below.

According to the methods of the present invention, a two dimensional slice of an object in the presence of a static magnetic field of an NMR spectrometer is sensitized by standard procedures. In the sensitized slice, the magnetization of the spins is transverse to the static field. A time varying magnetic field gradient is then applied within the slice so the frequency history of the spins in each element of the two dimensional slice is distinguishable from that of every other element in the slice. The nuclei in the slice then radiate electromagnetic energy which is sampled, and the sampled electromagnetic energy is converted by reconstruction means to spin information for each element in the two dimensional slice. Each of these steps, excitation, spatial differentiation and image reconstruction, can be carried out in accordance with the general principles disclosed in the Likes patent, subject to the improvements set forth below. In one method of the present invention, the effect of time varying magnetic fields that do not sample equal areas of phase space in equal time is compensated for during the reconstruction phase. In another method of the present invention, the effect of time varying magnetic fields that do not sample equal areas of phase space in equal time is compensated for during the sampling phase (i.e., sampling is performed at non-uniform time intervals so that such sample represents an equal area of phase space). In other methods of the present invention, a unique class of magnetic field gradients is used, which provides time varying magnetic fields that sample equal areas of phase space during equal time intervals.

According to the first method of the present invention, any gradient magnetic field trajectory which substantially covers two dimensional phase space may be used to map that space. During image reconstruction, an appropriate weighting function is applied to account for the failure of the gradient field to pass through equal area increments in equal time intervals.

According to the second method of the invention, a weighting function is used to determine the time periods at which the radiated electromagnetic energy is to be sampled. Even though the trajectories of the magnetic field gradients do not pass through equal phase space areas during equal time intervals, the sampling periods over which the radiated electromagnetic energy is detected can be altered to compensate for the spatially nonlinear characteristics of the gradients. Examples 2 and 3 below apply this aspect of the invention to a sinusoidal and Archimedian spiral trajectory, respectively. The detection of the radiated electromagnetic energy is performed at the termination of each unequal time interval such that each sample of radiated electromagnetic energy corresponds to an equal area of phase space. As shown below, these time intervals are determined with reference to the trajectory and weighting function. According to a third embodiment of the invention, a specific subclass of Archimedian spiral gradient field trajectories has been determined that map equal area elements in equal time intervals.

Examples 1 and 2

One method of the present invention involves the use of an appropriate weighting function to weight the received radiated electromagnetic energy signals to compensate for the non-uniform time varying magnetic field gradients that do not sample equal area increments of phase space with equal time.

In accordacne with this first method, a two dimensional slice of a sample is sensitized by standard procedures, such as those disclosed in the Likes patent beginning at column 3, line 44, bridging to column 4, line 2. Sensitizing the slice of the object induces transverse magnetization in the sensitized region of the sample. A time varying magnetic field having gradients in the x and y directions is then applied to the sensitized region of the sample in order to spatially differentiate the radiated electromagnetic signals as disclosed in the Likes patent at column 4, line 2, to column 5, line 53. The spatially differentiated radiated electromagnetic energy signals can be represented by the two dimensional Fourier transform $F(f_1,f_2)$ as described in Ernst in "NMR Fourier Zeugma—Topography," Vol. 18, pp. 69–83 of the Journal of Magnetic Resonance (1975), as follows:

$$F(f_1,f_2) = \int\int \rho(x,y)e^{i(f_1x+f_2y)}e^{-(t_1+t_2)/T_2}dxdy \qquad (1)$$

wherein $\rho(x,y)$ is the spin information in the (x,y) plane; wherein the phases of the applied gradient field, as shown in FIG. 1, are defined $f_1=c_1t_1$, and $f_2=c_2t_2$; and wherein the applied gradient field is defined for the x direction ($H_x=c_1x$) and for the y direction ($H_y=c_2y$.) The terms $c_1$ and $c_2$ are constants which are proportional to the gradient fields in the x and y directions, respectively. These well known principles are disclosed in the Likes Patent at Column 4, lines 26 to 68. As described in the Likes Patent at column 4, lines 26 to 68, the two functions $f_1(t)$ and $f_2(t)$ are determined from the magntic gradient fields $H_x(t)$ and $H_y(t)$, respectively, where $$f_1(t) = (\gamma/x)\int_0^t H_x(t')dt \text{ and } f_2(t) = (\gamma/y)\int_0^t H_y(t')dt$$

where gamma is the gyromagnetic ratio.

The reconstructed form of the local spin density ($\rho$) at point (x,y) can be determined from the inverse Fourier transform of the radiated electromagnetic energy signals.

The inverse Fourier transform is defined as:

$$\rho(x,y) = \sum_{f_1}\sum_{f_2} F(f_1,f_2)e^{-i(f_1x+f_2y)}e^{(t_1+t_2)/T_2}\Delta t_1 \Delta t_2 \qquad (2)$$

wherein the summation is performed over time increments ($\Delta t_1$, $\Delta t_2$) in ($f_1$, $f_2$) space.

Figure 2:
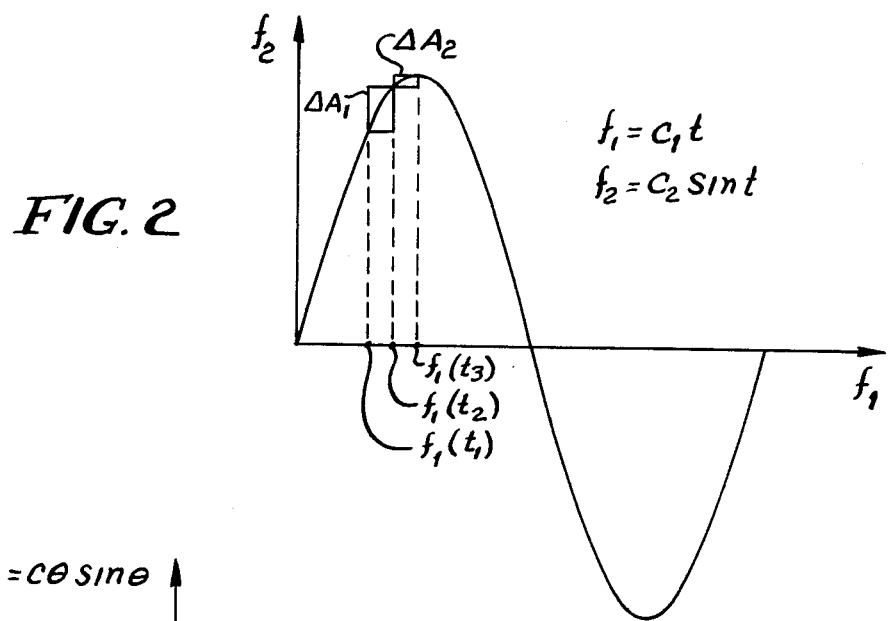
FIG. 2 is a graphic depiction of a trajectory which maps unequal areas of phase space over equal time periods.

However, $f_1$ and $f_2$ may both be defined as a function of a single time parameter (t) wherein the gradient fields are defined $H_x=c_1x$ and $H_y=c_2y \cos t$ with the corresponding phases $f_1=c_1t$ and $f_2=c_2 \sin t$ as shown in FIG. 2. In order to ensure mapping of the entire slice, $c_2$ is defined to be much larger than $c_1$. As shown in FIG. 2, this gradient field function does not map through equal areas $\Delta A$ of ($f_1$, $f_2$) phase space in equal time intervals, that is, sin t is not linear in t. Thus, an appropriate weighting function (W(t)) must be applied to correctly reconstruct spin information. As a result, the corrected inverted Fourier transform is given by:

$$\rho(x,y) = \Sigma F(f_1,f_2)e^{-i(f_1x+f_2y)}e^{t/T_2}W(t)\alpha t^2 \qquad (3)$$

wherein for the above defined gradient fields $W(t)=c_1c_2 \cos t$ and the summation is performed over equal time intervals $\Delta t$ and wherein $W(t)\Delta t^2=\Delta A$.

Alternatively after the weighting function has been determined, one may map for equal areas in phase space by sampling the radiated electromagnetic energy at unequal time intervals. In accordance with this second method, the weighting function is used to determine the unequal time intervals at which to sample the radiated electromagnetic energy at intervals which correspond to equal areas. By sampling at unequal time periods which have been correlated by the weighting function to equal areas mapped by the gradients, the detected electromagnetic energy need not be corrected by the weighting function prior to reconstructing the image. Rather, compensation is achieved at the sampling phase instead of the image reconstruction phase. The unequal time interval is obtained by requiring the area element $\Delta A_i$ to be constant ($\Delta A_i = \Delta A$):

$$\Delta A = c_1 c_2 \Delta t_i^2 \cos t_i \tag{4}$$

Solving for $\Delta t_i$ one then obtains:

$$\Delta t_i = \left[\frac{\Delta A}{c_1 c_2 \cos t_i}\right]^{\frac{1}{2}} \tag{5}$$

It should be understood that nearly any gradient field function that substantially covers two dimensional phase space may be substituted for the above functions and may be appropriately weighted on reconstruction. Alternatively, almost any gradient field function that substantially covers two dimensional phase space may be used to map equal areas in phase by imposing an equal area condition on the sampling time intervals, as shown above for one method.

Examples 3 and 4

Figure 3:
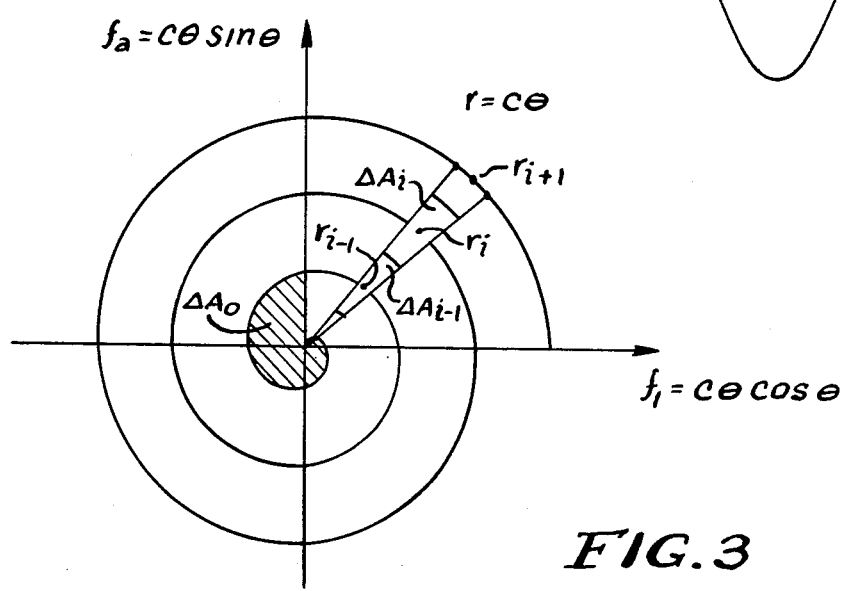
FIG. 3 is a graphic depiction of an Archimedian spiral trajectory in phase space.

As shown by the Likes Patent at column 11, line 25, and referring to FIG. 3 of the drawings, the phase space trajectory of the Archimedian spiral is given by the equation $$r = c\theta \tag{6}$$

The trajectory of the Archimedian spiral as given by equation 6 can also be defined in terms of $f_1$ and $f_2$ phase space wherein:

$$f_1 c\theta \cos \theta \tag{7}$$

$$f_2 = c\theta \sin \theta \tag{8}$$

Referring again to FIG. 3, each area $\Delta A_i$, over which the trajectory of the Archimedian spiral maps during a given time period can be defined as a trapazoid having the dimensions $\frac{1}{2}(r_{i+1} - r_{i-1})$ and $r_i d\theta$. Accordingly, the area $\Delta A_i$ can be defined:

$$\Delta A_i - \frac{1}{2}(r_{i+1} - r_{i-1}) r_i d\theta \tag{9}$$

where $r_i = c\theta_i$, $r_{i+1} = c(\theta_i + 2\pi)$ and $r_{i-1} = C(\theta_i - 2\pi)$, substituting these values for $r_i$, $r_{i+1}$ and $r_{i-1}$ into equation 9 yields:

$$\Delta A_i = 2\pi c^2 \theta_i d\theta/dt \Delta t_i \tag{10}$$

For the general case where $\theta$ is defined to be equal to t, the area $\Delta A_i$ is given by:

$$\Delta A_i = 2\pi c^2 t \Delta t \tag{11}$$

Referring to FIG. 3, the trajectory of the above-defined Archimedian spiral is dependant on time because it accelerates as it radiates outwardly, and as a result, will not map through equal areas of phase space $\Delta A_i$, $\Delta A_{i-1}$ over equal time periods. Accordingly, use of the methods disclosed by the Likes Patent without compensating for the spatial nonlinearity of the trajectory of the Archimedian spiral over time will result in inaccuracies.

However, by using the methods of the present invention, the area $\Delta A$ can be required to be constant, and by defining $\theta$ to again equal t, equation 11 can be used to determine unequal time intervals $\Delta t_i$ over which equal areas of phase space can be mapped:

$$\Delta t_i = \Delta A / 2\pi c^2 t_i \tag{12}$$

Thus, applicant has recognized that the general Archimedian spiral in fact does not map through equal areas of phase space over equal time intervals, and that by mapping at unequal time intervals, accurate data can be collected and improved images reconstructed.

In addition, applicant has discovered that a select subset of the Archimedian spiral can be defined which in fact does map through equal areas in equal time. If $\Delta A_i$ and $\Delta t_i$ are both required to be constant (thereby assuring that equal areas are mapped during equal time intervals), and referring again to Equation 10 it is determined that $$\theta_i d\theta/dt = \Delta A / 2\pi c^2 \Delta t \tag{13}$$

Since $\Delta A$, $\Delta t$ and c are all constants, solving for $\theta$ yields $$\theta = (A + Bt)^{\frac{1}{2}} \tag{14}$$

where A and B are arbitrarily chosen constants. Substituting the value of $\theta$ from equation 14 into equation 10 verifies that the specifically defined Archimedian spiral will in fact map through equal areas of phase space over equal time periods as shown in equation 15 below.

$$\Delta A = \pi c^2 B \Delta t \tag{15}$$

Referring to FIG. 3, it can be seen that the area element given by equation 10 is not valid for the first cycle of the spiral from 0 to $2\pi$. Accordingly, the area $\Delta A_o$ over which the trajectory passes during the first $2\pi$ cycle must be separately determined. Using basic geometry, and with respect to the above-identified Archimedian spiral, this area is determined to be:

$$\Delta A_o C^2 [\pi^2/3 + 11\pi t/6] \Delta t \tag{16}$$

The foregoing is intended to illustrate the methods of the present invention and are not intended to limit its scope. As one skilled in the art would recognize, many modifications may be made to the present invention which fall within its scope and spirit. Specifically, one would recognize that the two dimensional methods described herein may be readily modified to perform three dimensional NMR imaging.

What is claimed is:

1. In a method for nuclear magnetic resonance imaging comprising sensitizing a region of an object in a static magnetic field wherein the magnetization of the spins are transverse to the static field, applying a time varying magnetic field gradient to the sensitized region of the object, detecting radiated electromagnetic energy from the sensitized region, and reconstructing spin information for each element within the region from the received radiated electromagnetic energy signals, the improvement comprising:

weighting the detected radiated electromagnetic energy signals to compensate for the use of time varying magnetic field gradients that do not sample equal areas of phase space in equal time intervals.

2. A method, as claimed in claim 1, wherein the spin information is reconstructed according to the equation:

$$p(x,y) = \Sigma F(f_1,f_2) e^{-i(f_1 x + f_2 y)} e^{(t/T_2)} W(t) \Delta t^2$$

wherein $F(f_1,f_2)$ is the Fourier transform of the detected, radiated electromagnetic energy signals, $f_1$ and $f_2$ are the phase parameters in the x and y directions, respectively, $f_1 = c_1 t$ and $f_2 = c_2 \sin t$, $T_2$ is the transverse relaxation time, $W(t)$ is the weighting function, $W(t) = c_1 c_2 \cos t$, and $c_1$ and $c_2$ are constants.

3. In a method for nuclear magnetic resonance imaging comprising sensitizing a region of an object in a static magnetic field wherein the magnetization of the spins are transverse to the static field, applying a time varying magnetic field gradient to the sensitized region of the object, the field gradient having a nonlinear trajectory which does not map through equal areas of phase space in equal time intervals, detecting radiated electromagnetic energy from the sensitized region, and reconstructing spin information for each element within the region from the received radiated electromagnetic energy signals, the improvement comprising:
sampling the radiated electromagnetic energy at varying time intervals, the varying time intervals being correlated to the nonlinear trajectory of the field gradient such that the radiated electromagnetic energy is sampled at equal area elements of phase space.

4. In a method for nuclear magnetic resonance imaging comprising sensitizing a region of an object in a static magnetic field wherein the magnetization of the spins are transverse to the static field, spatially differentiating radiated electromagnetic energy from the sensitized region of the object, detecting the radiated electromagnetic energy from the sensitized region, and reconstructing spin information for each element within the region from the received radiated electromagnetic energy signals, the improvement comprising:
spatially differentiating the radiated electromagnetic energy by applying to the sensitized region a time varying magnetic field gradient which has a trajectory which maps through equal areas $\Delta A_i$ of phase space during equal time intervals, the magnetic field gradient having phases $f_1$ and $f_2$ defined by $f_1 = c\theta \cos\theta$ and $f_2 = c\theta \sin\theta$, and wherein the area $\Delta A_i$ over which the trajectory maps during equal time periods is given by $$\Delta A_1 = 2\pi c^2 \theta_i d\theta_i / dt \Delta t_i$$

wherein $\Delta A_i$ and $\Delta t_i$ are constant, and $\theta = (A + B)^{\frac{1}{2}}$, wherein A and B are constants.

5. In a method for nuclear magnetic resonance imaging comprising sensitizing a region of an object in a static magnetic field wherein the magnetization of the spins are transverse to the static field, applying a time varying magnetic field gradient to the sensitized region of the object, detecting radiated electromagnetic energy from sensitized region, and reconstructing spin information for each element within the region from the received radiated electromagnetic energy signals, the improvement comprising:
employing a magnetic field gradient which maps an Archimedian spiral trajectory according to the equation $r = c\theta$ and wherein the gradient maps unequal areas $\Delta A$ during equal time periods $\Delta t$ the unequal areas being defined by $$\Delta A = 2\pi c^2 \theta d\theta / dt \Delta t$$

wherein c is a constant; and
sampling the radiated electromagnetic signals from the sensitized region at unequal time periods $\Delta t_i$, the unequal time periods $\Delta t_i$ being determined so that the sampling occurs as the trajectory maps through equal areas of phase space $\Delta A_i$, and the unequal time periods $\Delta t_i$ being defined by $$\Delta t_i = \Delta A / 2\pi c^2 t_i$$

wherein $\Delta A$ and c are constants.

6. A method for nuclear magnetic resonance imaging comprising:
sensitizing a region of an object in a static magnetic field to cause net magnetization of nuclear spins transverse to the static field;
inducing nuclear spin relaxation in the sensitized region of the object, the spin relaxation being characterized by radiated electromagnetic energy;
spatially differentiating the radiated electromagnetic energy signals by applying a time varying magnetic field gradient to the sensitized region of the object, the time varying magnetic field gradient having a trajectory passing through unequal areas of the sensitized region over equal time periods;
detecting the spatially differentiated electromagnetic energy signals;
weighting the detected electromagnetic energy signals to compensate for the spatially nonlinear trajectory of the magnetic field gradient with respect to time; and
reconstructing the nuclear spin density for each spatially differentiated location within the sensitized region of the object from the weighted electromagnetic energy signals.

7. A method for nuclear magnetic resonance imaging comprising:
sensitizing a region of an object in a static magnetic field to cause net magnetization of the nuclear spins transverse to the static field;
inducing nuclear spin relaxation in the sensitized region of the object, the nuclear spin relaxation being characterized by radiated electromagnetic energy;
spatially differentiating the electromagnetic energy signals corresponding to the spin relaxation by applying a time varying magnetic field gradient to the sensitized region of the object, the time varying magentic field gradient having a trajectory passing through unequal areas of the sensitized region over equal time periods;
sampling the spatially differentiated electromagnetic energy signals at unequal time intervals, the unequal time intervals being correlated to the spatially nonlinear trajectory of the magnetic field gradient with respect to time; and
reconstructing the nuclear spin density for each spatially differentiated location within the sensitized region of the object from the sampled electromagnetic energy signals.

* * * * *

UNITED STATES PATENT AND TRADEMARK OFFICE
CERTIFICATE OF CORRECTION

PATENT NO. : 4,642,567

DATED : February 10, 1987

INVENTOR(S) : Jerome I. Kaplan

It is certified that error appears in the above-identified patent and that said Letters Patent is hereby corrected as shown below:

Title page, Abstract: Second column, line 23, "may" should be -- map --.

Column 1, line 11, "is" should be --in--;

Column 1, line 51, "may" should be --map--;

Column 2, line 16, cancel ",";

Column 3, line 64, "accordacne" should be --accordance--;

Column 5, line 41, "$f_1 c\theta\cos\theta$" should be --$f_1 = c\theta\cos\theta$--;

Column 5, line 47, "trapazoid" should be --trapezoid --;

Column 5, Equation (9), that portion of the equation reading "$\Delta A_i - \frac{1}{2}($" should read --$\Delta A_i = \frac{1}{2}($--;

Column 5, line 53, "$r_i - 1 = C(\theta_i - 2\pi)$" should be --$r_i - 1 = c(\theta_i - 2\pi)$--;

Column 5, Equation (10), that portion of the equation reading "$= 2\pi c^2 \theta_i d\theta/dt \Delta t_i$" should read --$= 2\pi c^2 (d\theta_i/dt)\Delta t_i$--;

Signed and Sealed this

First Day of December, 1987

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,642,567

DATED : February 10, 1987

INVENTOR(S) : Jerome I. Kaplan

It is certified that error appears in the above-identified patent and that said Letters Patent is hereby corrected as shown below:

Column 5, Equation (11), that portion of the equation reading "$=2\pi c^2 t \Delta t$" should read $--=2\pi c^2 t_i \Delta t--$;

Column 6, line 40, "area $\Delta Ao$" should be --areas $\Delta A_i$--;

Column 6, Equation (16) should read as follows:
$\Delta A_i = c^2 [\pi^2/3 + 11\pi t_i/6] \Delta t$;

IN THE CLAIMS:

Column 7, line 52, the equation should read
$--\Delta A_i = 2\pi c^2 \theta_i (d\theta_i/dt) \Delta t_i --$;

Column 7, line 54, that portion of the equation reading "$=(A+B)^2$" should read $--=(A+Bt)^2--$;

Column 8, line 5, the equation should read:
$--\Delta A_i = 2\pi c^2 \theta_i (d\theta_i/dt) \Delta t--$;

Column 8, line 15, that portion of the equation reading "$=\Delta A/2\pi c^2 t_i$" should read $--=\Delta A/(2\pi c^2 \theta_i (d\theta_i/dt))--$;